US006619385B2

(12) United States Patent
Watanabe et al.

(10) Patent No.: US 6,619,385 B2
(45) Date of Patent: Sep. 16, 2003

(54) COOLING APPARATUS FOR COOLING ELECTRIC ELEMENT

(75) Inventors: Michinori Watanabe, Tokyo (JP);
Michihiro Suzuki, Tokyo (JP);
Toshiyuki Nakamura, Tokyo (JP)

(73) Assignee: Sanyo Denki Co., Ltd., Tokyo (JP)

( * ) Notice: Subject to any disclaimer, the term of this patent is extended or adjusted under 35 U.S.C. 154(b) by 184 days.

(21) Appl. No.: 09/823,003

(22) Filed: Mar. 30, 2001

(65) Prior Publication Data

US 2001/0028106 A1 Oct. 11, 2001

(30) Foreign Application Priority Data

Mar. 31, 2000 (JP) ........................................ 2000-096692

(51) Int. Cl.[7] .................................................. H05K 7/20
(52) U.S. Cl. ........................ 165/121; 165/80.3; 361/697
(58) Field of Search ................................ 165/80.3, 121; 361/697

(56) References Cited

U.S. PATENT DOCUMENTS

| | | | |
|---|---|---|---|
| 5,629,834 A | * 5/1997 | Kodama et al. | ............ 361/695 |
| 5,910,694 A | 6/1999 | Yokozawa et al. | |
| 5,979,541 A | * 11/1999 | Saito | ........................... 165/80.3 |
| 6,132,170 A | * 10/2000 | Horng | ......................... 415/178 |
| 6,439,299 B1 | * 8/2002 | Miyahara et al. | ............ 165/121 |

* cited by examiner

Primary Examiner—Allen Flanigan
(74) Attorney, Agent, or Firm—Rankin, Hill, Porter & Clark LLP

(57) ABSTRACT

The present invention provides a cooling apparatus which can increase air flow. A plurality of blades 25 are provided with extending portions 25b of the blades which extend outwardly in the direction of the diameter of the axis 9a of the motor 9 and rotate at such a space that is outside and surrounds the opening 13 in the space 17. The extending portions 25b of the blades are integrally formed with the blades 25. The rim portions 25c of the extending portions 25b of the blades which are disposed on the side of the first wall part and extend along the first wall part are sloped so as to be gradually away from the first wall part 15 as they extend toward the edges.

3 Claims, 1 Drawing Sheet

COOLING APPARATUS FOR COOLING ELECTRIC ELEMENT

BACKGROUND OF THE INVENTION

The present invention relates to a cooling apparatus for directly or indirectly cooling electronic elements such as MPUs.

FIG. 9 to FIG. 11 of U.S. Pat. No. 5,910,694 show a cooling apparatus having a structure in which air is exhausted or discharged from one side of a heat sink. In many of conventional cooling apparatuses improvement was made on the impeller with a plurality of blades of an axial flow fan which sucks air from one side of the axial direction and exhausts the air to the other side of the axial direction. The improvement was made in such manner that the fan may discharge as much air as possible in the radial direction. In this type of conventional cooling apparatuses, the impeller with a plurality of blades is rotated by a motor in an opening defined in a case body which constitutes an air duct.

In conventional cooling apparatuses the diameter of the impeller is smaller than the diameter of the opening of the case body and the blades are rotating inside the opening. To increase the air flow of conventional cooling apparatuses it is necessary to increase the speed of the motor. However, there is a limitation to the increase of air flow which can be achieved by increasing the speed of the motor and also there arises a problem of noise getting larger.

SUMMARY OF THE INVENTION

It is an object of the present invention to provide a cooling apparatus which can increase air flow without increasing the speed of the motor. It is another object of the present invention to provide a cooling apparatus with reduced noise.

A cooling apparatus of the present invention comprises a case body having a first wall part with an opening through which air is sucked in, a base having a second wall part which faces the first wall part defining a space between the first wall part and the second wall part, an impeller having a plurality of blades which rotate inside the opening, and a motor for rotating the impeller. The case body is fixed to the base. Air is sucked in through the opening and discharged through and outside said space. According to the present invention, the blades are provided with extending portions at the ends thereof which are integrally formed with blades and rotate in said space. According to the present invention, it is possible to stir up the stagnant air in the space between the first wall part and the second wall part and to discharge the air vigorously outside from the discharge port. Therefore it is possible to increase air flow without increasing the speed of the motor.

An embodiment of a cooling apparatus according to the present invention comprises a case body having a first wall part with an opening through which air is sucked in, a base having a second wall part which faces the first wall part defining a space between the first wall part and the second wall part, wherein the case body is fixed to the base, a peripheral wall part disposed between the first wall part and the second wall part surrounding said space so as to leave a discharge port which communicates with said space, an impeller with a plurality of blades which rotate inside the opening, and a motor for rotating the impeller, and a plurality of webs holding the motor by connecting the housing of the motor and the first wall part. The revolving shaft of the motor is positioned such that its axis extends in a direction which is perpendicular to a direction in which the first wall part and the second wall part extend. The revolving shaft is supported by a bearing which is fixed to the housing in such a structure that the shaft will not come off from the bearing. Air sucked in through the opening is discharged from the discharge port. In this case also blades are provided with extending portions at the ends thereof which extend outward in the radial direction of the shaft and rotate in the space which is outside and surrounds the opening. The extending portions of the blades are integrally formed with the blades.

It is preferable that the edges of extending portions of the blades which face the first wall part and extend along the first wall part are sloped so as to be gradually away from the first wall part as they extend toward the ends. In this way the noise generated due to the air flow between the blades and the first wall part can be made smaller and thus it is possible to reduce the noise.

It is preferable to define the inside shapes of the first wall part and the second wall part so that the cross-section area of a portion of the space adjacent to the discharge port becomes larger as it approaches toward the discharge port. In this way pressure loss around the exit can be minimized and the reduction of air flow can be avoided.

A variety of structures can be used for a base and a heat sink itself can be used as a base.

DETAILED DESCRIPTION OF THE PREFERRED EMBODIMENT

Figure 1:
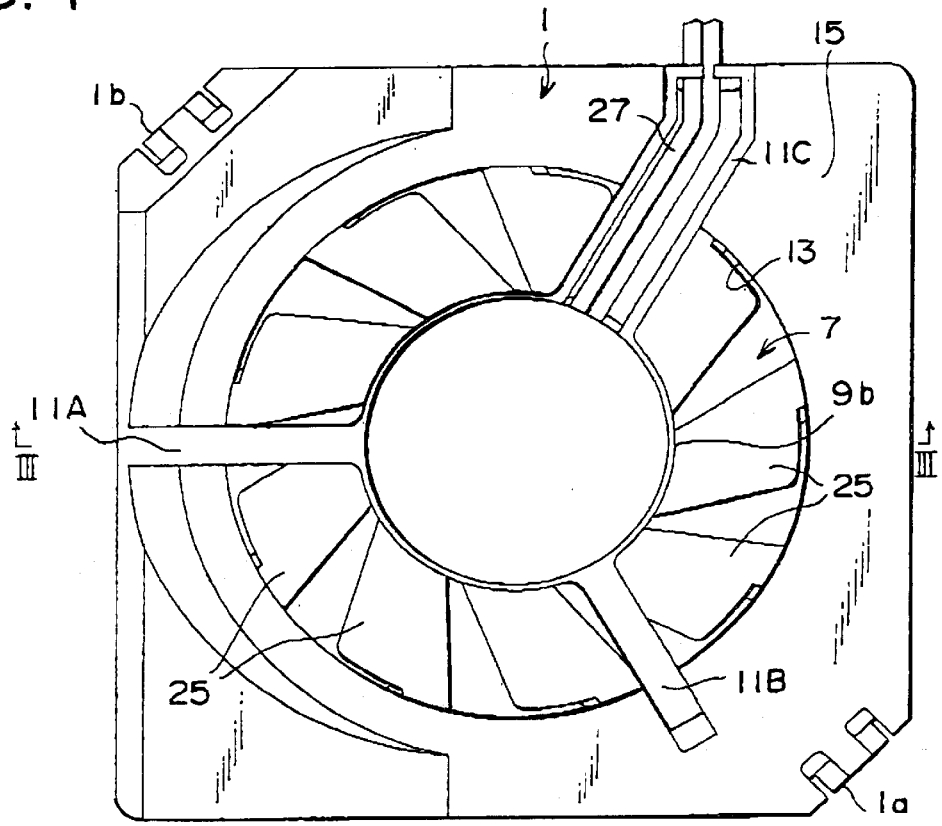
FIG. 1 is a front view of the cooling apparatus of an embodiment of the present invention.
Figure 2:
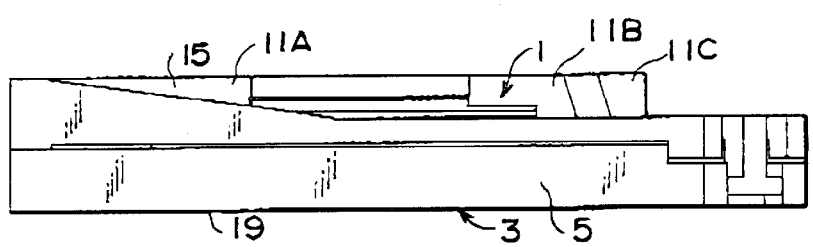
FIG. 2 is a side view of the cooling apparatus of the embodiment of the present invention.
Figure 3:
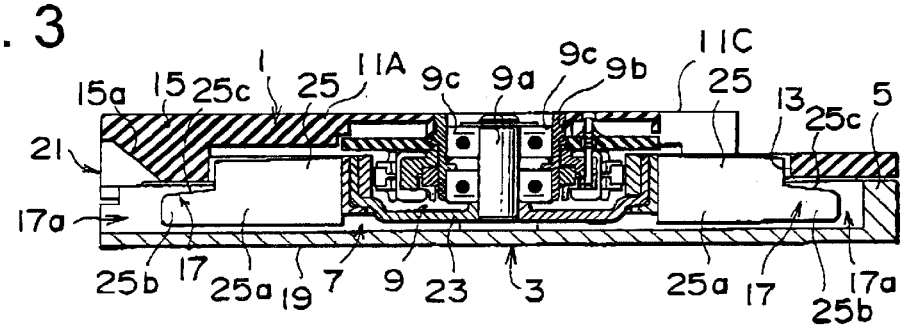
FIG. 3 is a cross sectional view of FIG. 1 taken along III—III line.

Referring to drawings a preferable embodiment of the present invention will be described below. FIGS. 1 and 2 are a front view and a side view of the cooling apparatus of an embodiment of the present invention. FIG. 3 is a section view of FIG. 1 taken along III—III line. As shown in each figure, the cooling apparatus in this embodiment comprises a case body 1, a base 3, a peripheral wall 5 between the case body 1 and base 3, an impeller 7, a motor 9 for rotating the impeller 7 and three webs 11A–11C. The case body 11 has a first wall part 15 which is hexagonal in shape and has an opening 13 to suck in air. The dimension of the thickness of the first wall part 15 becomes larger toward the discharge port on the left of the drawing, which discharge port is to be described about later. The shape of the inside wall 15a of the thicker portion is arranged to slope so that a cross-section area of a portion 17a of a space 17 adjacent to the discharge port 21 becomes larger as it approaches toward the discharge port 21. The case body 1 is provided with a pair of hooks 1a and 1b with which the case body is engaged with the peripheral wall 5. With these hooks the case body 1 is separably joined with the peripheral wall 5. This attachment structure using hooks is shown in the U.S. Pat. No. 5,615,998.

Base 3 constitutes an aluminum heat sink having a hexagonal second wall part 19 which faces the first wall part defining a space 17 between the first wall part 15 and the second wall part 19. The base 3 is provided integrally with a peripheral wall part 5 which stands up from the rim of the second wall part 19. The peripheral wall 5 is disposed to surround the space 17 so as to leave a discharge port 21 which communicates with the space 17.

The impeller 7 has a cup element 23 and nine blades 25 which are formed integrally around the cup element 23. The blades 25 comprise blade bodies or main parts 25a which are disposed corresponding to the opening 13 and extending portions 25b which are integrally formed with the blade bodies 25a. The extending portions 25b of the blades 25b extend outward in the radial direction of the shaft 9a of the motor 9 and are disposed in the space 17 that is outside and surrounds the opening 13 (the space between the first wall part and the second wall part) and rotate in this space 17. Also the extending portions 25b of the blades 26 have edges 25c which face an inside surface of the first wall part 15 and extend along the first wall part 15. The edges 25c are sloped so as to be gradually away from the first wall part 15 as they extend toward the ends. When the motor 9 rotates and the blades 25 rotate, air sucked in through the opening 13 is discharged through the space 17 and from the discharge port 21. As in this embodiment, since blades 25 are provided with extending portions 25b, the area of each blade itself becomes larger and the air flow increases. Especially the air in the space 17 between the first wall part 15 and the second wall part 19 can be discharged effectively. Therefore the cooling effect is heightened without increasing the speed of the motor.

An axis of the shaft 9a of the motor 9 extends in a direction which is perpendicular to a direction in which the first wall part and the second wall part extend. The shaft 9a is supported by a bearing 9c fixed to the housing 9b in such a structure that the shaft 9a will not come off from the bearing 9c.

The webs 11A–11C support the motor 9 by connecting the housing 9b and the case body 1. The motor 9 is positioned at the center of the opening 13 for sucking air. And in one of the webs, 11C, a cable 27 for supplying electric power to motor 9 is received. In this embodiment the case body 1, the housing 9b of the motor 9 and the three webs 11A–11C are integrally formed of a material whose primary ingredient is synthetic resin.

In the above embodiment the inside wall 15a of the first wall part 15 is sloped so that the cross-section area of the portion 17a of the space 17 adjacent to the discharge port 21 becomes larger as it approaches toward the discharge port 21. This variation in the cross-section area of the portion 17a of the space 17 can be realized by sloping at least one of the first wall part 15 and the second wall part 19.

According to the present invention, stagnant air in the space between the first wall part and the second wall part can be stirred and effectively exhausted from the discharge port because the plurality of blades are provided with the extending portions of the blades. Therefore air flow can be increased without increasing the speed of the motor thereby heightening the cooling effect.

While the invention has been shown and described with respect to a specific embodiment thereof, this is intended for the purpose of illustration rather than limitation and other variations and modifications of the specific device herein shown and described will be apparent to those skilled in the art, all within the intended spirit and scope of the invention. Accordingly, the patent is not to be limited in scope and effect to the specific device herein shown and described nor in any other way that is inconsistent with the extent to which the progress and the art has been advanced by the invention.

What is claimed is:

1. A cooling apparatus comprising:

a case body having a first wall part with an opening through which air is sucked in;

a base having a second wall part which faces said first wall part and cooperating with said first wall part to define a space between said first wall part and said second wall part, said case body being attached to said base;

a peripheral wall disposed between said first wall part and said second wall part to surround said space so as to leave a discharge port which communicates with said space;

an impeller having a plurality of blades which rotate inside said opening;

a motor for rotating said impeller;

a housing for said motor; and a plurality of webs for supporting said motor by connecting said housing for said motor and said first wall part;

wherein a revolving shaft of said motor is positioned such that its axis extends in a direction which is perpendicular to a direction in which said first wall part and said second wall part extend;

said revolving shaft is supported by a bearing fixed to said housing such that said shaft will not come off from said bearing; and air sucked in through said opening is discharged through said discharge port;

wherein said plurality of blades are provided with extending portions at ends of said blades, said extending portions extending outward in a radial direction of said shaft and rotate in the space that is outside of said opening, said extending portions of blades being integrally formed with said blades; and wherein an inside shape of said first wall part is defined so that a cross-sectional area of a portion of said space adjacent to said discharge port becomes larger as it approaches toward the discharge port in order to avoid a reduction of airflow.

2. The cooling apparatus as defined in claim 1, wherein edges of said extending portions of said plurality of blades which face said first wall part and extend along said first wall part are sloped so as to extend gradually away from said first wall part as said extending portions extend toward the ends.

3. The cooling apparatus as defined in claim 1, wherein said base is a heat sink.

* * * * *